(12) United States Patent
Takahashi

(10) Patent No.: US 9,502,545 B2
(45) Date of Patent: Nov. 22, 2016

(54) FIELD EFFECT SEMICONDUCTOR DEVICE

(71) Applicant: FUJITSU LIMITED, Kawasaki-shi, Kanagawa (JP)

(72) Inventor: Tsuyoshi Takahashi, Ebina (JP)

(73) Assignee: FUJITSU LIMITED, Kawasaki (JP)

(*) Notice: Subject to any disclaimer, the term of this patent is extended or adjusted under 35 U.S.C. 154(b) by 152 days.

(21) Appl. No.: 14/547,440

(22) Filed: Nov. 19, 2014

(65) Prior Publication Data

US 2015/0171202 A1 Jun. 18, 2015

(30) Foreign Application Priority Data

Dec. 17, 2013 (JP) ................... 2013-259820

(51) Int. Cl.
*H01L 29/739* (2006.01)
*H01L 29/66* (2006.01)
*H01L 29/205* (2006.01)
*H01L 29/36* (2006.01)
*H01L 29/08* (2006.01)

(52) U.S. Cl.
CPC ..... *H01L 29/7391* (2013.01); *H01L 29/66356* (2013.01); *H01L 29/0895* (2013.01); *H01L 29/205* (2013.01); *H01L 29/365* (2013.01)

(58) Field of Classification Search
CPC ........... H01L 29/2003; H01L 29/7391; H01L 29/66356; H01L 29/0895; H01L 29/205; H01L 29/365
USPC ........................................................ 257/194
See application file for complete search history.

(56) References Cited

U.S. PATENT DOCUMENTS

| | | | | |
|---|---|---|---|---|
| 5,729,030 A | * | 3/1998 | Yamamoto et al. | .......... 257/103 |
| 2003/0001195 A1 | * | 1/2003 | Mori | ................. H01L 21/28273 257/315 |
| 2007/0267652 A1 | * | 11/2007 | Amasuga et al. | ............. 257/147 |
| 2009/0078966 A1 | * | 3/2009 | Asai et al. | ..................... 257/194 |
| 2012/0267609 A1 | * | 10/2012 | Liang et al. | ..................... 257/39 |

* cited by examiner

*Primary Examiner* — Fernando L Toledo
*Assistant Examiner* — Neil Prasad
(74) *Attorney, Agent, or Firm* — Kratz, Quintos & Hanson, LLP

(57) ABSTRACT

In order to reduce the source resistance in a field effect semiconductor device, an electron injection layer, which causes a band-to-band tunnel current to flow between a source electrode and a channel forming layer of which the central portion is a channel layer, is provided on the channel forming layer on the side in contact with the channel layer.

10 Claims, 16 Drawing Sheets

RELATED ART

RELATED ART

FIELD EFFECT SEMICONDUCTOR DEVICE

CROSS-REFERENCE TO RELATED APPLICATION

This application is based upon and claims the benefit of priority of the prior Japanese Patent Application No. 2013-259820, filed on Dec. 17, 2013, the entire contents of which are incorporated herein by reference.

FIELD

The present invention relates to a field effect semiconductor device, for example, a high-frequency field effect semiconductor device which operates at low voltage or low power to reduce the operating voltage of the device.

BACKGROUND

A conventional field effect semiconductor device, such as a silicon MOSFET, permits large-scale integration of elements and has various functions. Furthermore, improvements in operating speed are being made and the gate length is being progressively shortened and the thickness of the gate oxide film is becoming progressively thinner.

However, there is a problem in that as the gate length is made progressively shorter, the leakage current becomes more liable to flow into the channel when the drain current is off. This is because the standby power becomes notable when the scale of integration is increased, and therefore is undesirable from the viewpoint of power consumption. Consequently, a device structure which suppresses power consumption has been sought. For example, a tunnel FET using a tunneling effect has been proposed, instead of a conventional FET which electrons travel in the channel by diffusion drift (see, for example, Appl. Phys. Lett. Vol. 67, 494 (1995)), and therefore this composition is explained with reference to FIGS. 7 to 9B.

FIG. 7 is a schematic cross-sectional diagram of a conventional tunnel FET, in which a $p^{++}$-type source region 64 and an $n^{++}$-type drain region 65 doped with a high concentration of impurities that enables degeneration of the carrier are provided in a p-type silicon substrate 61, and a gate electrode 63 is provided on a gate insulating film 62 between these regions. The reference numerals 66 and 67 in FIG. 7 indicate a source electrode and a drain electrode.

FIGS. 8A to 8C are principal band diagrams of a conventional tunnel FET, where FIG. 8A is a band diagram of an unbiased state, in which the carrier degenerates, and therefore the Fermi level $E_{fp}$ is to the lower side of the valence band $E_{vp}$ in the $p^{++}$-type source region 64. On the other hand, the Fermi level $E_{fn}$ is to the upper side of the conduction band $E_{cn}$ in the $n^{++}$-type drain region 65.

FIG. 8B is a band diagram of a state where the gate potential $V_g$ is applied to the gate electrode 63, and in this state, the drain potential $V_d$ is not applied to the drain electrode 67 and therefore the carrier does not flow.

FIG. 8C is a band diagram of a state where the gate potential $V_g$ is applied to the gate electrode 63 and a drain potential $V_d$ is applied to the drain electrode 67. In this state, the electrons injected from the $p^{++}$-type source region 64 reach the $n^{++}$-type drain region 65 by a band-to-band tunnel which tunnels through a depletion layer formed at the interface between the p-type silicon substrate 61 and the $n^{++}$-type drain region 65.

FIGS. 9A and 9B are illustrative diagrams of the characteristics of a conventional tunnel FET, wherein FIG. 9A is a characteristics graph of a conventional two-terminal type device, and FIG. 9B is a characteristics graph of a normal FET using a diffusion current and a tunnel FET. Since the tunnel current rises suddenly in a tunnel FET, then it is possible to reduce the voltage swing between switching on and off of the drain current, and moreover, since the current is reduced suddenly when switched off, then the sub-threshold characteristics (sub-threshold slope) are improved compared to the two-terminal type device characteristics and the normal FET characteristics.

Furthermore, it has also been proposed to introduce a tunnel injection in a GaAs-type HEMT (see, for example, Japanese Patent Application Publication No. H08-186271), and therefore this configuration is described with reference to FIG. 10. FIG. 10 is a schematic cross-sectional diagram of a conventional GaAs tunnel HEMT. An i-type GaAs electron travelling layer 73 is formed via an i-type AlGaAs insulating layer 72 on top of a semi-insulating GaAs substrate 71. An n-type AlGaAs electron supplying layer 74 and an i-type AlGaAs insulating layer 75, and a gate electrode 76 are provided thereon. An $n^+$-type GaAs source region 77 and a $p^+$-type GaAs drain region 78 are provided on either edge of the gate electrode 76. The reference numerals 79 and 80 in FIG. 10 indicate the source electrode and the drain electrode. In this case also, the sub-threshold characteristics are improved in comparison with the characteristics of a two-terminal type device.

On the other hand, there has been an increase in attempts to use compound semiconductors that have higher electron mobility than silicon, in the channels, as a method for raising the speed of MOSFETs instead of shortening the gate length. GaAs is a typical example of a compound semiconductor, but a GaAs MOSFET has not been achieved due to the high number of defect levels in the oxidation film. Therefore, a GaAs HEMT which does not use a gate oxide film (n-type AlGaAs/i-type GaAs hetero-selective doping structure) has been invented. Furthermore, an InP HEMT (n-type InAlAs/i-type InGaAs structure) is also used from the viewpoint of obtaining high speed characteristics.

The source resistance needs to be reduced in order to raise the speed of the InP HEMT, but since a resistance occurs due to the hetero-junction which is characteristic of the HEMT, there still remain problems with improvement, and therefore this situation is described here with reference to FIGS. 11 and 12B. FIG. 11 is a schematic cross-sectional diagram of a conventional InP HEMT. An i-type InAlAs buffer layer 82, an i-type InGaAs channel layer 83, an i-type InAlAs spacer layer 84, a planar doping layer 85, an i-type InAlAs Schottky barrier layer 86 and an n-type InGaAs layer are layered successively on top of the semi-insulating InP substrate 81. A two-dimensional electron gas layer 87 is formed at the interface between the i-type InGaAs channel layer 83 and the i-type InAlAs spacer layer 84. Thereupon, the n-type InGaAs layer is broken up to create n-type InGaAs cap layers 88 and 89, a gate electrode 90 is formed therebetween and a source electrode 91 and a drain electrode 92 are formed on top of the n-type InGaAs cap layers 88 and 89.

FIGS. 12A and 12B are band diagrams of a conventional InP-type HEMT, wherein FIG. 12A is a band diagram along the single-dotted line linking A-A' in FIG. 11, and FIG. 12B is a band diagram along the single-dotted line linking B-B' in FIG. 11. As illustrated in FIG. 12A, directly below the gate electrode 90, a drain current flows due to the two-dimensional electron gas layer 87 which is formed at the interface between the i-type InGaAs channel layer 83 and the i-type InAlAs spacer layer 84.

On the other hand, on the source electrode side, as illustrated in FIG. 12B, the i-type InAlAs Schottky barrier layer 86 and the i-type InAlAs space layer 84 form a potential barrier to the electrons, and therefore the source resistance becomes greater.

Furthermore, in recent years, it has been reported that a stable oxide film can be formed on InGaAs (see, for example, Appl. Phys. Lett. Vol. 91, 232107 (2007)), and attention has been drawn to InGaAs channel MOSFETs, rather than HEMT structures.

SUMMARY

However, in an InP-type MOSFET which uses InGaAs that can form a stable oxide film, in the channel layer, there is a problem in that the barrier of the wide-band-gap electron supplying layer which is characteristic of the HEMT structure, is not resolved. Furthermore, in order to operate with lower power consumption, in other words, with a low power source voltage, an operation using tunneling is needed for the electrons which flow due to diffusion drift normally.

Consequently, the object is to reduce the source resistance in the field effect semiconductor device.

One aspect of this disclosure presents a field effect semiconductor device, including: a channel forming layer; a channel layer provided in a central portion of the channel forming layer; a gate electrode provided in contact with the channel layer; an electron injection layer, which is provided on the channel forming layer on the side in contact with the channel layer and which causes a band-to-band tunnel current to flow between a source electrode and the channel forming layer; and a drain electrode provided on top of the channel forming layer and positioned on the opposite side of the channel layer from the source electrode.

According to the field effect semiconductor device disclosed in the invention, it is possible to reduce the source resistance.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
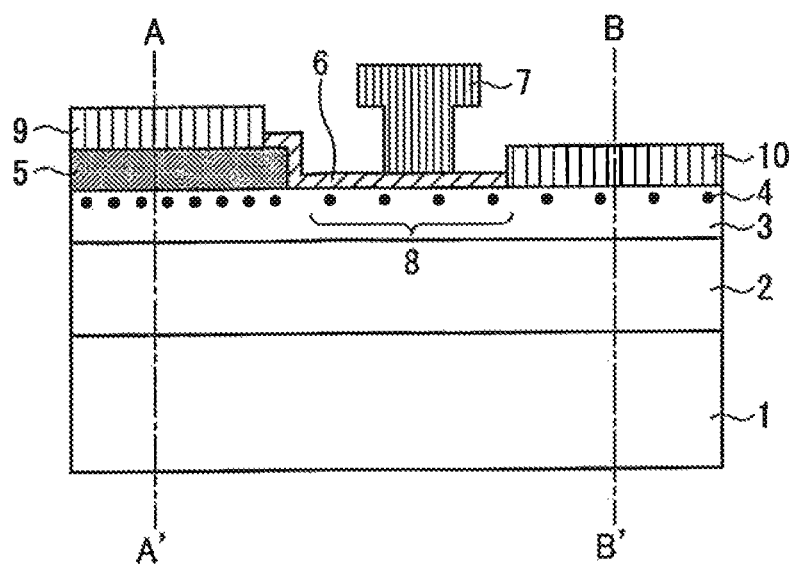
FIG. 1 is a schematic cross-sectional diagram of a field effect semiconductor device according to an embodiment of the present invention.
Figure 2A:
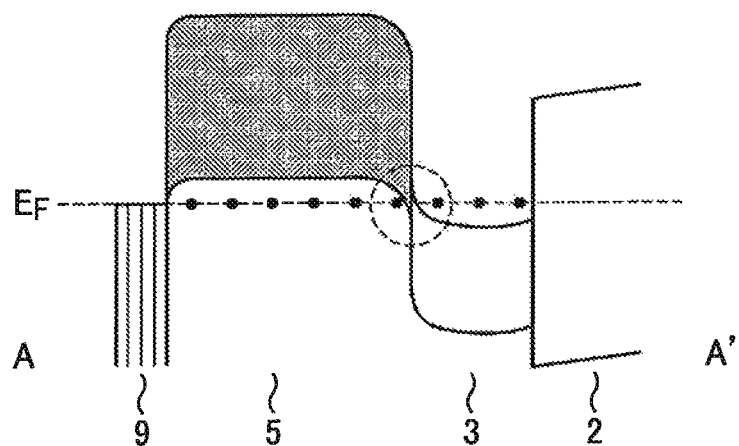
FIGS. 2A and 2B are principal band diagrams of a field effect semiconductor device according to an embodiment of the present invention.
Figure 2B:
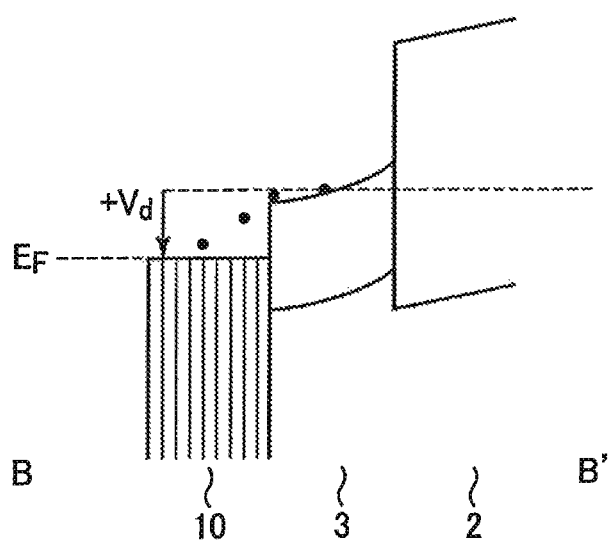

Here, the field effect semiconductor device according to an embodiment of the present invention are described, with reference to FIGS. 1 to 2B. FIG. 1 is a schematic cross-sectional diagram of a field effect semiconductor device according to an embodiment of the present invention, in which a channel forming layer 3 is provided on a substrate 1 via a buffer layer 2, and an electron injection layer 5 which injects electrons by a band-to-band tunnel current is provided directly below the source electrode 9. Furthermore, a gate electrode 7 is provided on a gate insulating film 6 near the source electrode 9, and furthermore a drain electrode 10 is formed on the opposite side of the gate electrode 7 from the source electrode 9. The channel forming layer 3 between the electron injection layer 5 and the drain electrode 10 forms a channel layer 8. A two-dimensional electron gas layer 4 appears on the growth surface side of the channel forming layer. Furthermore, an inverse HEMT structure may be adopted by providing a planar doping layer in a region of the buffer layer 2 near the channel forming layer 3, but this layer has a subsidiary role.

FIGS. 2A and 2B are principal band diagrams of a field effect semiconductor device according to an embodiment of the present invention, wherein FIG. 2A is a band diagram along the single-dotted line linking A-A' in FIGS. 1 and 2B is a band diagram along the single-dotted line linking B-B' in FIG. 1. As illustrated in FIG. 2A, since the channel forming layer 3 and the electron injection layer 5 are made from materials that form a type II hetero-junction, then electrons are injected by band-to-band tunnel injection into the conduction band of the channel forming layer 3, from the valence band of the electron injection layer 5, and the source resistance is reduced.

On the other hand, about the drain electrode 10, as illustrated in FIG. 2B, it is possible to form a drain electrode 10 in direct contact with the channel forming layer 3 so as to form a Schottky junction, and the drain electrode 10 does not present a potential barrier to the electrons from the channel forming layer 3. Preferably, the drain electrode 10 forms an ohmic connection with the channel forming layer 3.

It is possible to use a silicon substrate, a GaAs substrate, an InP substrate, or the like, as the substrate 1. Furthermore, although i-type InGaAs is typical for the channel forming layer 3, it is possible to use another III-V compound semiconductor, such as i-type GaAs. The substrate 1 does not always need to be provided, and the electron injection layer 5 may be provided in contact with the surface of the channel forming layer 3 on the opposite side to the side where the gate electrode 7 is provided, and the electron injection layer 5 and the channel forming layer 3 on the side where the electron injection layer 5 is provided may be covered with a supporting layer made from resin. The resin may be any resin having high stability, but benzocyclobutene (BCB) which has low permittivity is preferable.

Furthermore, the electron injection layer 5 may form a type II hetero-junction with the channel forming layer 3, and is typically p-type GaAsSb, but it is preferable to use a III-V compound semiconductor containing at least Ga and Sb, such as p-type GaSb or p-type AlGaAsSb, or the like. Furthermore, in order to reduce the contact resistance with the source electrode 9, it is desirable to dope the layer with a high concentration of impurity such that the carrier degenerates.

By forming a type II hetero-junction in this way, at the interface of the hetero-junction which is indicated by the dotted circle in FIG. 2A, electrons are injected by band-to-band tunnel injection into the conduction band of the channel forming layer 3, from the valence band of the electron injection layer 5.

The gate insulating film may be any stable insulating film having a low film formation temperature; for example, an oxide film, such as $SiO_2$ film, $Al_2O_3$ film, or $HfO_2$ film, etc. The gate insulating film 6 does not always need to be provided, in which case an electrode material forming a Schottky junction with the channel forming layer 3 may be used for the gate electrode 7.

Figure 9A:
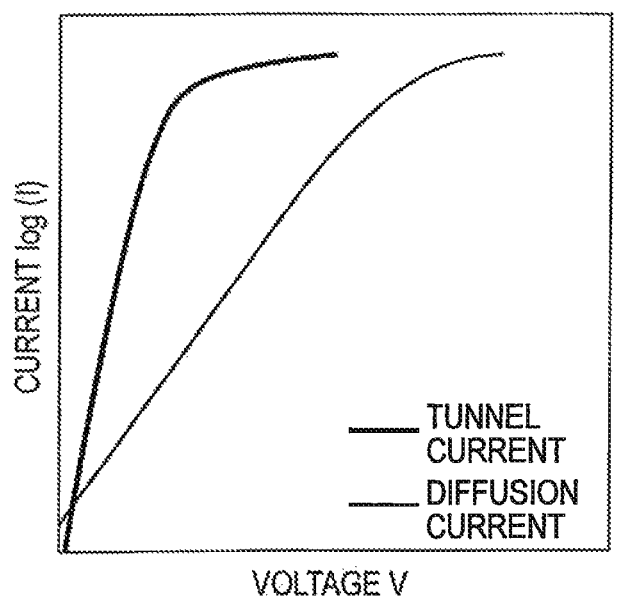
FIGS. 9A and 9B are illustrative diagrams of the characteristics of a conventional tunnel FET.
Figure 9B:
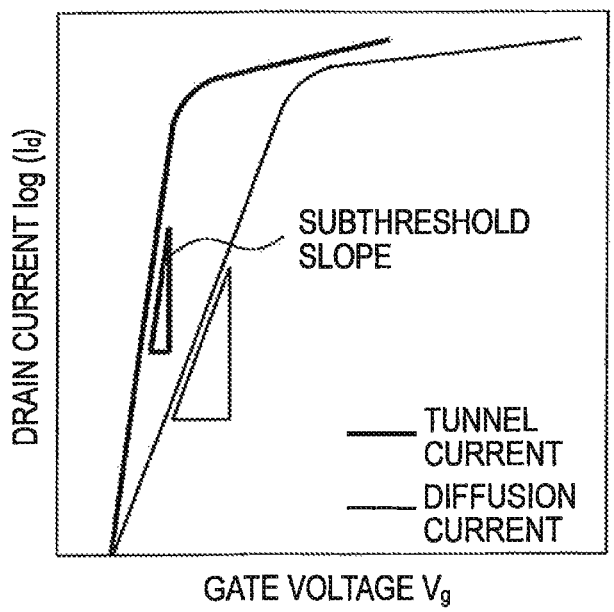
Figure 10:
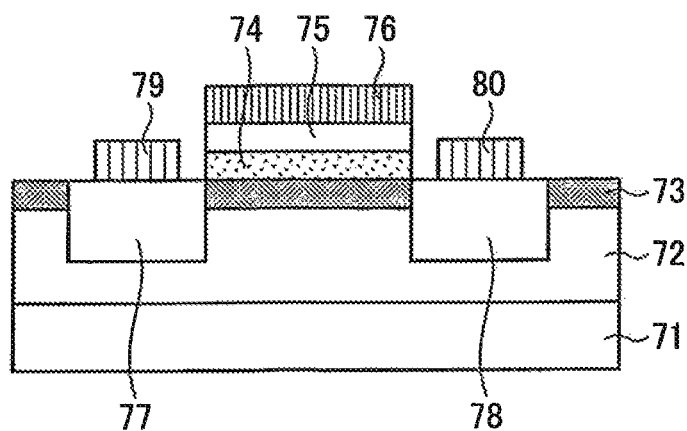
FIG. 10 is a schematic cross-sectional diagram of a conventional GaAs tunnel HEMT.
Figure 11:
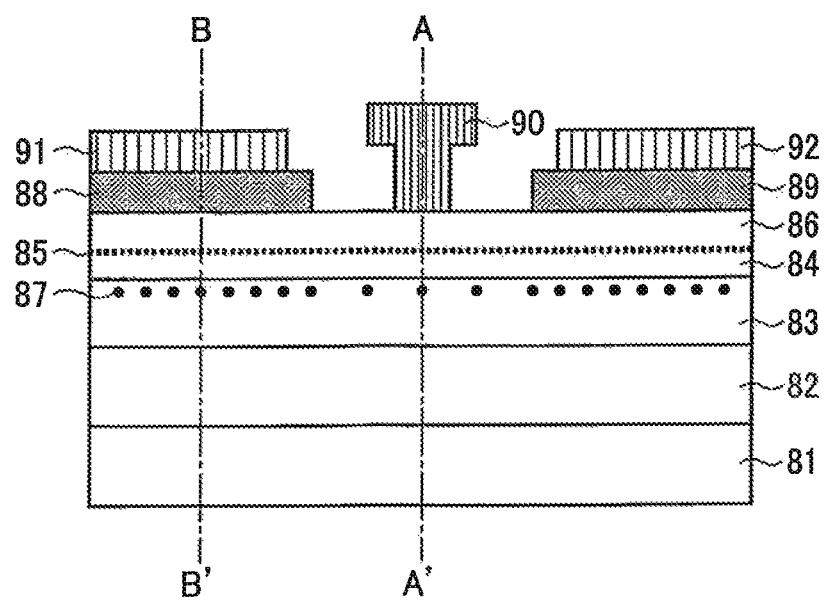
FIG. 11 is a schematic cross-sectional diagram of a conventional InP-type HEMT.
Figure 12A:
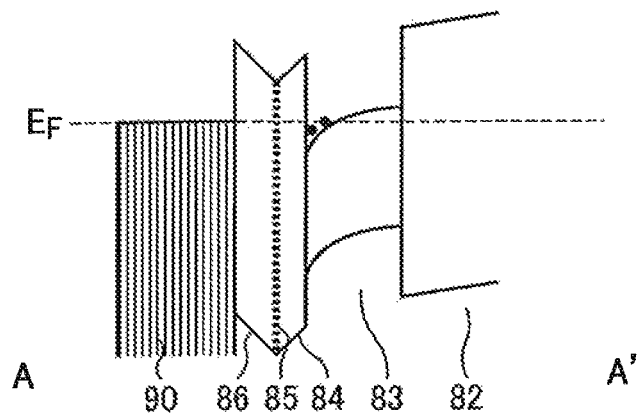
FIGS. 12A and 12B are band diagrams of a conventional InP-type HEMT.
Figure 12B:
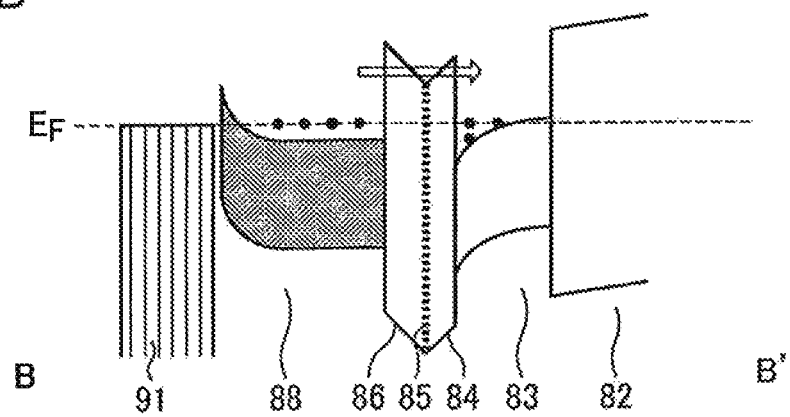

In this way, in an embodiment of the present invention, since a material forming a type II hetero-junction with the channel forming layer which can perform band-to-band tunnel injection is used as the electron injection layer provided on the source side, then the source resistance can be reduced. Moreover, the current produced by the tunnel electrons generates a sudden current change at a lower voltage, compared to a normal diffusion current, as illustrated in FIG. 9B described above. In particular, since the current shut-off properties when the current is switched from an on state to an off state are high, then it is possible to lower the power consumption by reducing the operating voltage.

First Embodiment

Figure 3:
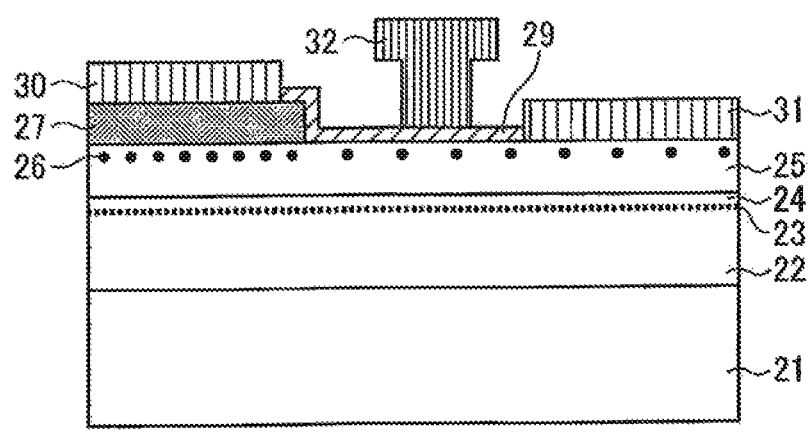
FIG. 3 is a schematic cross-sectional diagram of a tunnel electron supply-type MOSFET according to a first embodiment of the present invention.

Next, a tunnel electron supply-type MOSFET according to a first embodiment of the present invention will be described with reference to FIGS. 3 to 4F. FIG. 3 is a schematic cross-sectional diagram of a tunnel electron supply-type MOSFET according to the first embodiment of the present invention. An i-type InGaAs channel forming layer 25 is provided on top of the semi-insulating InP substrate 21, via the i-type InAlAs buffer layer 22, the planar doping layer 23, and the i-type InAlAs spacer layer 24. In this case, a two-dimensional electron gas layer 26 is formed on the top surface side of the i-type InGaAs channel forming layer 25.

A $p^+$-type GaAsSb electron injection layer 27 is provided between the i-type InGaAs channel forming layer 25 and the source electrode 30. This $p^+$-type GaAsSb electron injection layer 27 forms a type II hetero-junction with the i-type InGaAs channel forming layer 25. A gate electrode 32 is provided on a gate insulating film 29 made of $Al_2O_3$ film in a central portion of the i-type InGaAs channel forming layer 25. On the other hand, a drain electrode 31 is provided on the opposite side of the gate electrode 32 of the i-type InGaAs channel forming layer 25 from the source electrode 30, so as to make direct contact with the i-type InGaAs channel forming layer 25.

The band diagram for the vicinity of the source electrode 30 in this case is the same as the band diagram illustrated in FIG. 2A, and electrons are injected from the source electrode 30 into the valence band of the $p^+$-type GaAsSb electron injection layer 27. The injected electrons are injected into the conduction band of the i-type InGaAs channel forming layer 25 by band-to-band tunnel injection, at the interface between the $p^+$-type GaAsSb electron injection layer 27 and the i-type InGaAs channel forming layer 25.

The electrons supplied to the i-type InGaAs channel forming layer 25 advance towards the drain side through the i-type InGaAs channel forming layer 25 via the two-dimensional electron gas layer 26, and reach the drain electrode 31.

Figure 4A:
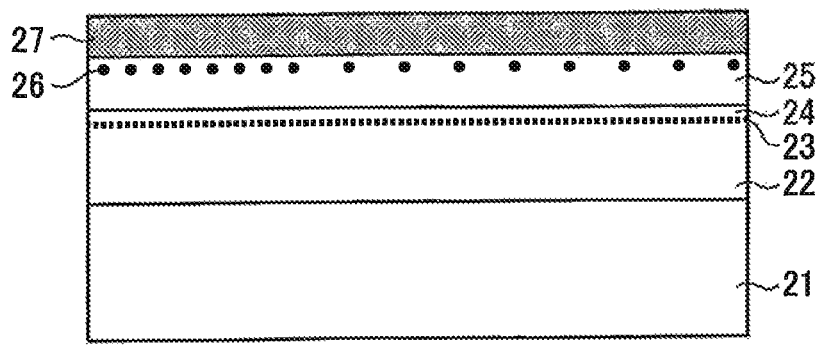
FIGS. 4A and 4B are illustrative diagrams up to an intermediate point of a process for manufacturing a tunnel electron supply-type MOSFET according to the first embodiment of the present invention.

Next, a manufacturing process for a tunnel electron supply-type MOSFET according to the first embodiment of the present invention will be described with reference to FIGS. 4A to 4F. Firstly, as illustrated in FIG. 4A, a 300 nm-thick i-type InAlAs buffer layer 22, a $2 \times 10^{12}$ $cm^{-2}$ planar doping layer 23, and a 3 nm-thick i-type InAlAs spacer layer 24 are successively formed by crystal growth on top of the semi-insulating InP substrate 21. Thereupon, a 10 nm-thick i-type InGaAs channel forming layer 25 and a 200 nm-thick $p^+$-type GaAsSb electron injection layer 27 having a Sb composition ratio of 0.49 and an impurity concentration of $2 \times 10^{19}$ $cm^{-3}$ are formed by crystal growth. The electrons supplied from the planar doping layer 23 collect inside the i-type InGaAs channel forming layer 25 and form a two-dimensional electron gas layer 26.

Figure 4B:
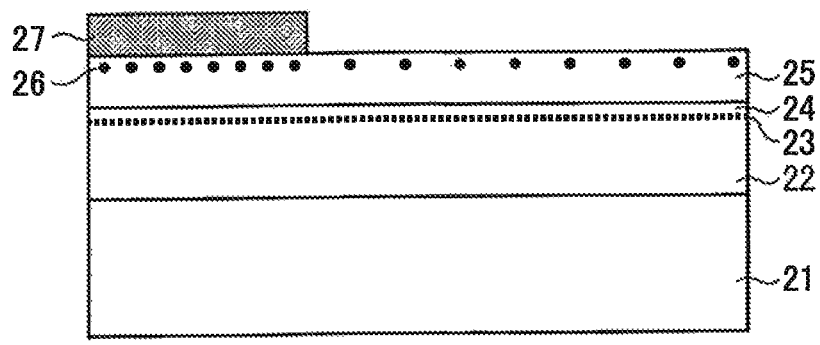

Next, as illustrated in FIG. 4B, after a source region is defined by photolithography (not illustrated), for example, the $p^+$-type GaAsSb electron injection layer 27 is etched by a mixed solution of phosphoric acid and aqueous hydrogen peroxide. In this case, the i-type InGaAs channel forming layer 25 is exposed in the region where the gate electrode and the drain electrode are formed, the etching is then terminated, and the photoresist is removed.

Figure 4C:
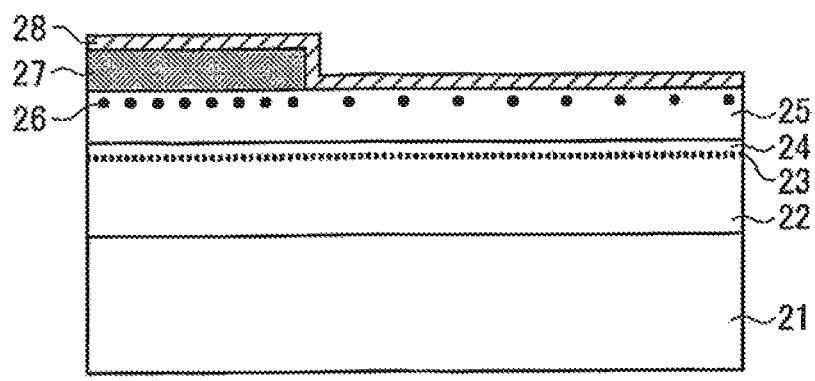
FIGS. 4C and 4D are illustrative diagrams following on from FIG. 4B up to an intermediate point of a process for manufacturing a tunnel electron supply-type MOSFET according to the first embodiment of the present invention.
Figure 4D:
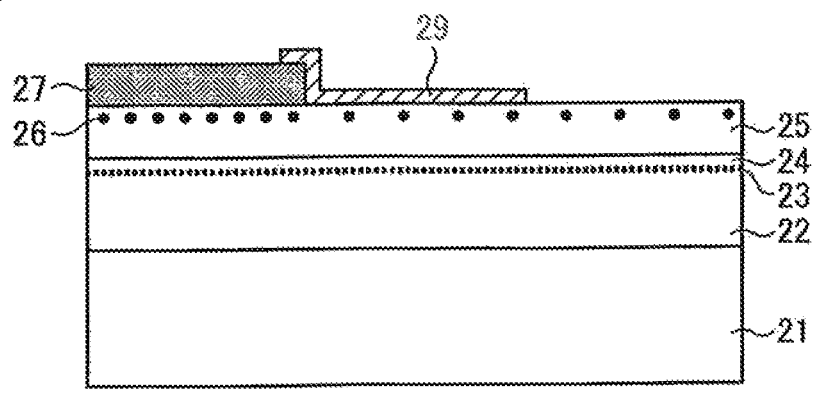

Thereupon, as illustrated in FIG. 4C, a 5 nm-thick $Al_2O_3$ film 28 is formed over the whole surface using atomic layer deposition (ALD) method. Next, as illustrated in FIG. 4D, a gate electrode forming section is defined by using photolithography, the surplus $Al_2O_3$ film 28 is removed by dry etching, and the remainder becomes the gate insulating film 29.

Figure 4E:
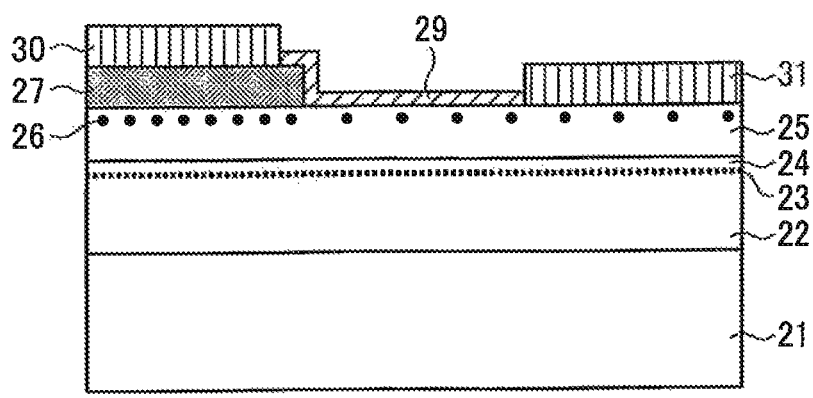
FIGS. 4E and 4F are illustrative diagrams following on from FIG. 4D of a process for manufacturing a tunnel electron supply-type MOSFET according to the first embodiment of the present invention.

Next, as illustrated in FIG. 4E, the source electrode section and the drain electrode section are defined by using photolithography, and then Ti (10 nm)/Pt (30 nm)/Au (300 nm) are vapor-deposited, and a source electrode 30 and a drain electrode 31 are formed simultaneously by a lift-off method.

Figure 4F:
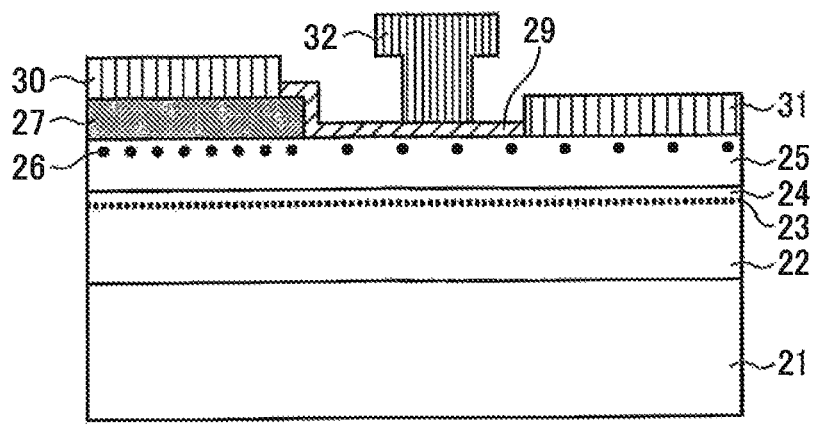

Thereupon, as illustrated in FIG. 4F, a gate electrode section is defined by using photolithography again, Ti (10 nm)/Pt (30 nm)/Au (300 nm) are vapor-deposited, and a gate electrode 32 are formed by a lift-off method. Here, a T-shaped gate electrode 32 is adopted in order to reduce the gate resistance, but it is also possible to adopt a normal rectangular gate electrode structure, if the device is restricted to digital uses which are not especially affected by the gate resistance. Furthermore, it is also possible to use a silicon substrate, instead of a semi-insulating InP substrate, for the substrate.

Second Embodiment

Figure 5A:
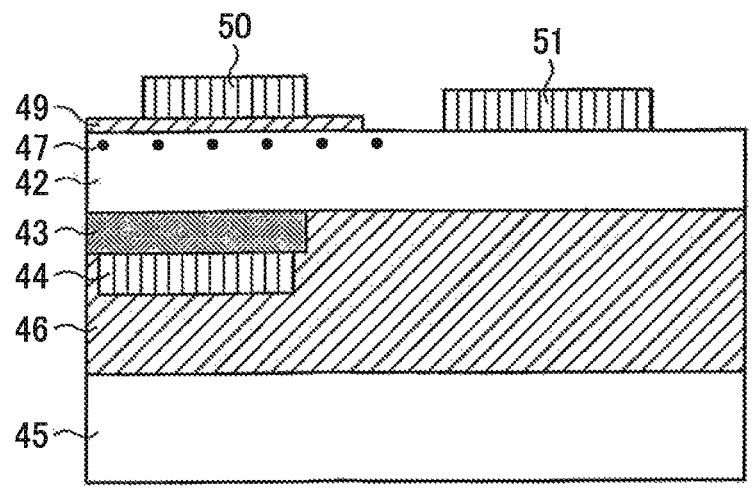
FIGS. 5A and 5B are illustrative diagrams of a tunnel electron supply type MOSFET according to a second embodiment of the present invention.
Figure 5B:
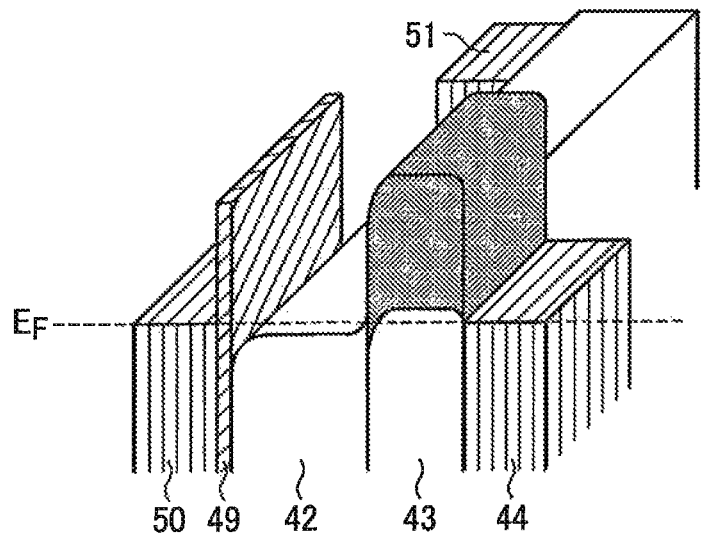

Next, a tunnel electron supply-type MOSFET according to a second embodiment of the present invention will be described with reference to FIGS. 5A to 6I. FIGS. 5A and 5B are illustrative diagrams of the tunnel electron supply-type MOSFET according to the second embodiment of the present invention; FIG. 5A is a schematic cross-sectional diagram and FIG. 5B is a perspective diagram depicting a band diagram. As illustrated in FIG. 5A, a source electrode 44 is provided at one end of one surface of the i-type InGaAs channel forming layer 42, via the p$^+$-type GaAsSb electron injection layer 43. A gate electrode 50 is provided on the other surface of the i-type InGaAs channel forming layer 42, in the portion opposing the source electrode 44, via a gate insulating film 49, and a drain electrode 51 is provided in the vicinity of the gate electrode 50. The side where the source electrode 44 is provided is covered with a BCB resin layer 46 provided on top of a silicon substrate 45, whereby the whole structure is supported.

As illustrated in FIG. 5B, the band diagram in this case illustrates that, on the side of the source electrode 44, electrons are injected in the thickness direction into the i-type InGaAs channel forming layer 42 directly below the gate electrode 50, by a band-to-band tunnel injection. On the side of the gate electrode 50, the band diagram is the same as that illustrated in FIG. 2B.

Figure 6A:
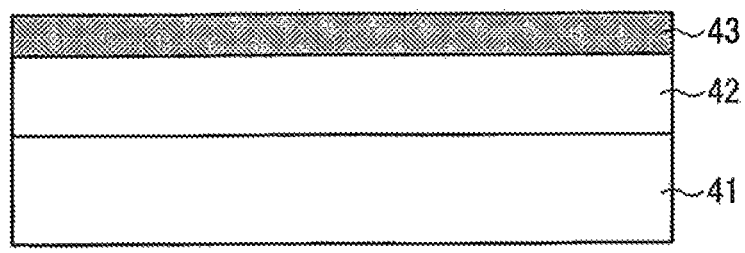
FIGS. 6A to 6C are illustrative diagrams up to an intermediate point of a process for manufacturing a tunnel electron supply-type MOSFET according to the second embodiment of the present invention.

Next, the manufacturing process for a tunnel electrode supply-type MOSFET according to the second embodiment of the present invention is described with reference to FIGS. 6A to 6I. Firstly, as illustrated in FIG. 6A, a 10 nm-thick i-type InGaAs channel forming layer 42, and a 200 nm-thick p$^+$-type GaAsSb electron injection layer 43 having a Sb composition ratio of 0.49 and an impurity concentration of $2 \times 10^{19}$ cm$^{-3}$ are formed by crystal growth on top of a semi-insulating InP substrate 41.

Figure 6B:
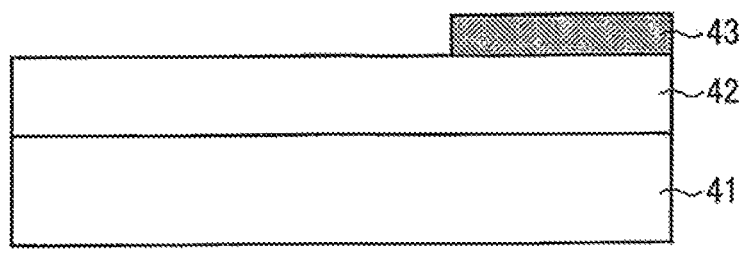

Next, as illustrated in FIG. 6B, after a source region is defined by photolithography (not illustrated), for example, the p$^+$-type GaAsSb electron injection layer 43 is etched by a mixed solution of phosphoric acid plus aqueous hydrogen peroxide. In this case, the i-type InGaAs channel forming layer 42 in the region where the gate electrode and the drain electrode are formed is exposed, etching is terminated, and then the photoresist is removed.

Figure 6C:
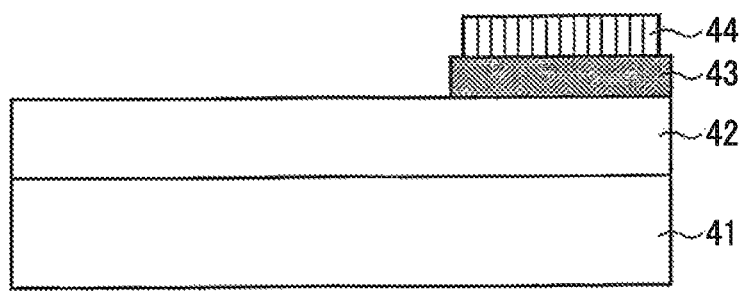

Thereupon, as illustrated in FIG. 6C, the peripheral region where the source electrode section has been formed is defined by using photolithography, Ti (10 nm)/Pt (30 nm)/Au (300 nm) is vapor-deposited, and a source electrode 44 is formed by a lift-off method.

Figure 6D:
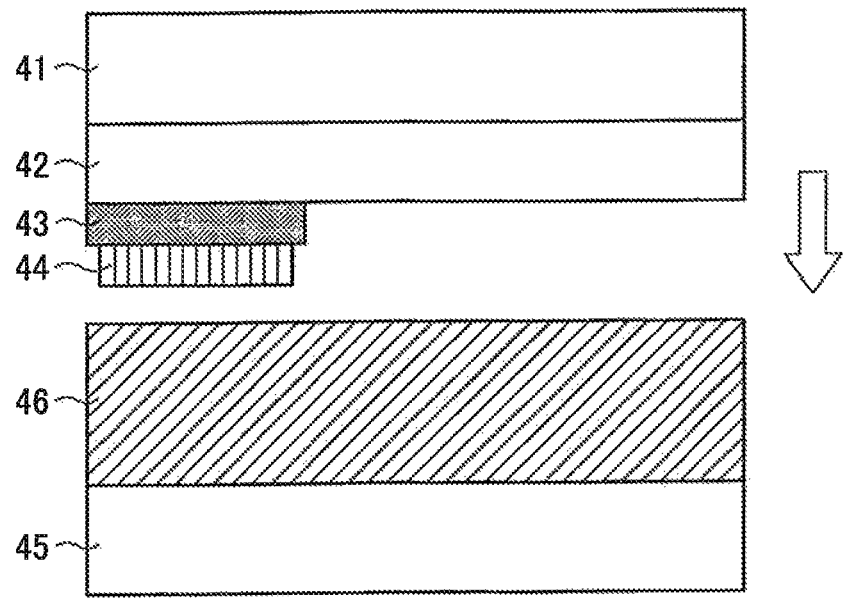
FIGS. 6D and 6E are illustrative diagrams following on from FIG. 6C up to an intermediate point of a process for manufacturing a tunnel electron supply-type MOSFET according to the second embodiment of the present invention.

Next, as illustrated in FIG. 6D, the device structure formed on the semi-insulating InP substrate 41 is turned over and bonded onto a silicon substrate 45 on which a BCB resin layer 46 having low permittivity has been coated and left in an uncured state.

Figure 6E:
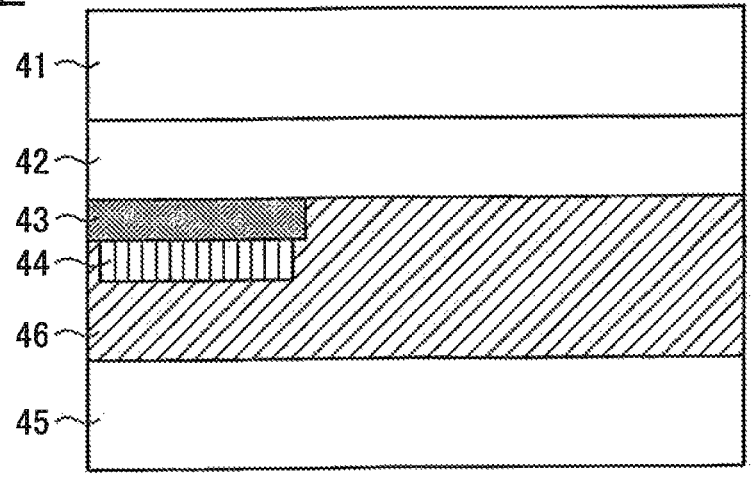

Thereupon, as illustrated in FIG. 6E, the whole wafer is kept at no less than 350° C. to cure the BCB resin layer 46, and the structure including the source electrode 44 is buried inside the BCB resin layer 46 provided on top of the silicon substrate 45.

Figure 6F:
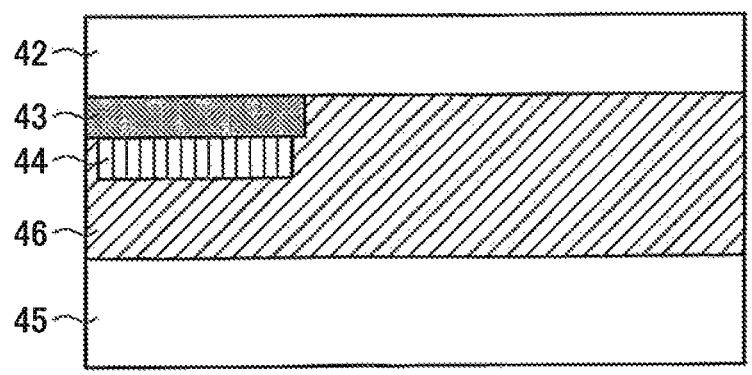
FIGS. 6F and 6G are illustrative diagrams following on from FIG. 6E up to an intermediate point of a process for manufacturing a tunnel electron supply-type MOSFET according to the second embodiment of the present invention.

Next, as illustrated in FIG. 6F, the semi-insulating InP substrate 41, which is the uppermost surface, is etched selectively using hydrochloric acid, for example, to expose the i-type InGaAs channel forming layer 42.

Figure 6G:
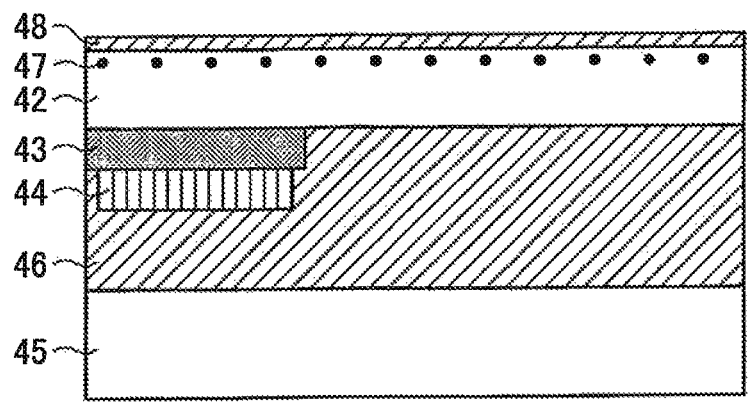
Figure 6H:
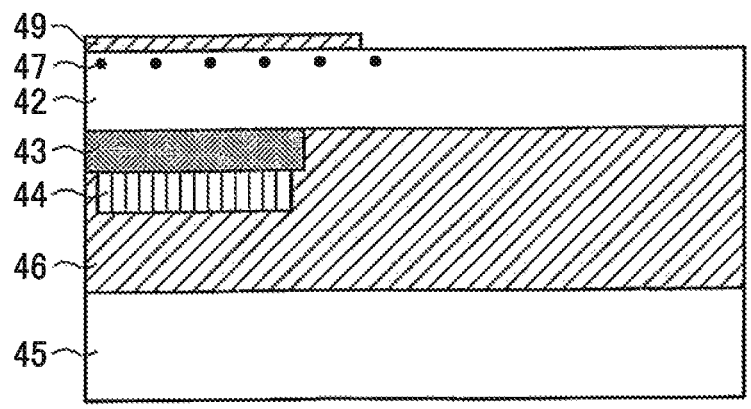
FIGS. 6H and 6I are illustrative diagrams following on from FIG. 6G of a process for manufacturing a tunnel electron supply-type MOSFET according to the second embodiment of the present invention.

Thereupon, as illustrated in FIG. 6G, a 5 nm-thick Al$_2$O$_3$ film 48 is formed over the whole surface using ALD method. Next, as illustrated in FIG. 6H, using photolithography, the Al$_2$O$_3$ film 48 is etched, leaving the gate electrode forming region, and the remainder becomes a gate insulating film 49. Since an inversion layer is formed in the channel contacting the Al$_2$O$_3$ film 48, then carriers are generated and a two-dimensional electron gas layer 47 is created.

Figure 6I:
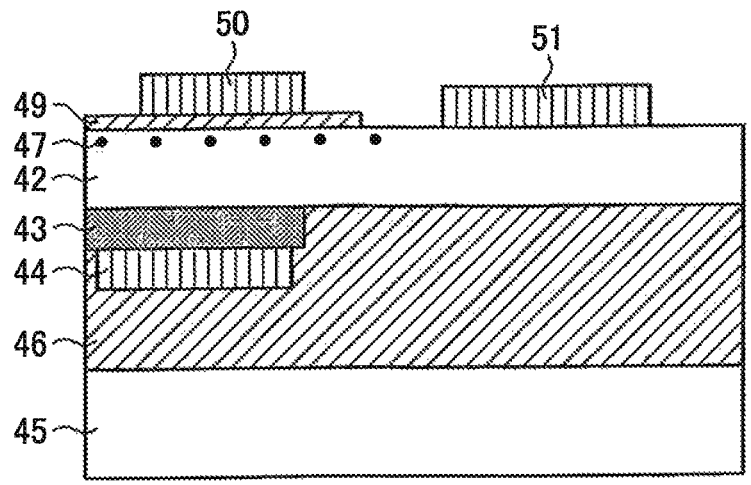
Figure 7:
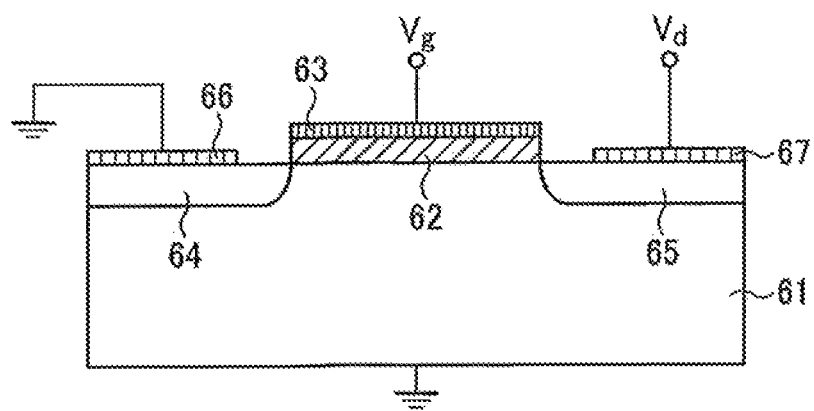
FIG. 7 is a schematic cross-sectional diagram of a conventional tunnel FET.
Figure 8A:
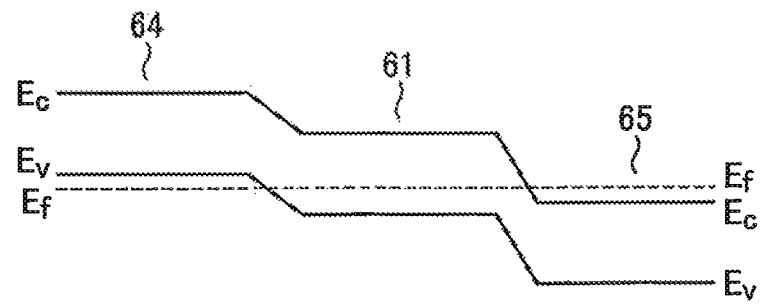
FIGS. 8A to 8C are band diagrams of a convention tunnel FET.
Figure 8B:
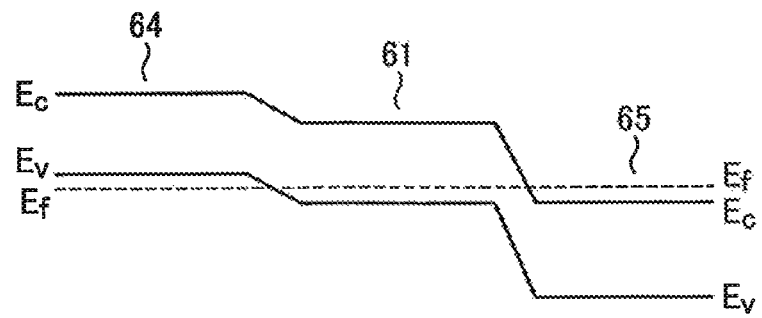
Figure 8C:
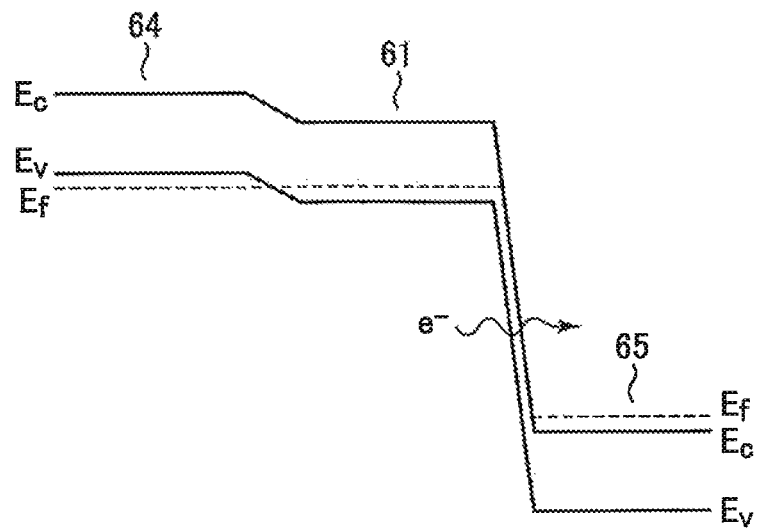

Next, as illustrated in FIG. 6I, a gate electrode and a drain electrode are defined using photolithography, Ti (10 nm)/Pt (30 nm)/Au (300 nm) are vapor-deposited, and the gate electrode 50 and the drain electrode 51 are formed by a lift-off method.

In this second embodiment of the present invention, a p$^+$-type GaAsSb electron injection layer forming a type II hetero-junction capable of band-to-band tunnel injection is interposed between the source electrode and the i-type InGaAs channel forming layer, and therefore the source resistance can be reduced.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A field effect semiconductor device, comprising:
   a channel forming layer;
   a channel layer provided in a central portion of the channel forming layer;
   a gate electrode provided in contact with the channel layer;
   an electron injection layer, which is provided on the channel forming layer on the side in contact with the channel layer and which causes a band-to-band tunnel current to flow between a source electrode and the channel forming layer; and
   a drain electrode provided on top of the channel forming layer and positioned on the opposite side of the channel layer from the source electrode.

2. The field effect semiconductor device according to claim 1, further comprising a gate insulating film between the gate electrode and the channel layer.

3. The field effect semiconductor device according to claim 2, wherein the gate insulating film is made from aluminum oxide.

4. The field effect semiconductor device according to claim 1, wherein the drain electrode is provided directly on the channel forming layer.

5. The field effect semiconductor device according to claim 1, wherein the channel forming layer is provided on a semiconductor substrate.

6. The field effect semiconductor device according to claim 5, wherein the semiconductor substrate is any one of a silicon substrate, an InP substrate and a GaAs substrate.

7. The field effect semiconductor device according to claim 1, wherein the electron injection layer is provided in contact with the channel forming layer on the surface thereof opposite to the side where the gate electrode is provided, and the electron injection layer and the channel forming layer on the side where the electron injection layer is provided are covered with a supporting layer made from resin.

8. The field effect semiconductor device according to claim 7, wherein the supporting layer is made from a benzocyclobutene resin.

9. The field effect semiconductor device according to claim 1, wherein the channel forming layer is made from InGaAs.

10. The field effect semiconductor device according to claim 1, wherein the electron injection layer is made from a III-V compound semiconductor containing at least Ga and Sb.

* * * * *